US007672348B2

(12) United States Patent
Patchell et al.

(10) Patent No.: US 7,672,348 B2
(45) Date of Patent: Mar. 2, 2010

(54) SEMICONDUCTOR LASER AND METHOD OF MANUFACTURE

(75) Inventors: John A. Patchell, Dublin (IE); Brian J. Kelly, Dublin (IE); James C. O'Gorman, Dublin (IE)

(73) Assignee: Eblana Photonics Limited, Dublin (IE)

( * ) Notice: Subject to any disclaimer, the term of this patent is extended or adjusted under 35 U.S.C. 154(b) by 656 days.

(21) Appl. No.: 11/328,517

(22) Filed: Jan. 9, 2006

(65) Prior Publication Data

US 2007/0211775 A1 Sep. 13, 2007

(51) Int. Cl.
*H01S 5/00* (2006.01)
(52) U.S. Cl. .................................. 372/46.01; 372/43.01
(58) Field of Classification Search ............. 372/49.01, 372/43.01, 46.01
See application file for complete search history.

(56) References Cited

U.S. PATENT DOCUMENTS

| 4,573,163 | A | * | 2/1986 | Kaminow | ..................... 372/96 |
| 4,599,729 | A | | 7/1986 | Sasaki et al. | |
| 4,608,697 | A | * | 8/1986 | Coldren | ..................... 372/50.1 |
| 4,839,308 | A | | 6/1989 | Fye | |
| 5,144,635 | A | | 9/1992 | Suhara | |
| 6,043,104 | A | * | 3/2000 | Uchida et al. | .................. 438/32 |
| 6,343,088 | B1 | | 1/2002 | Mugino et al. | |
| 6,978,057 | B1 | * | 12/2005 | O'Gorman et al. | ............. 385/14 |
| 2002/0064203 | A1 | * | 5/2002 | Pezeshki et al. | ................ 372/64 |

FOREIGN PATENT DOCUMENTS

| EP | 0349082 | 6/1989 |
| EP | 0579437 | 7/1993 |
| EP | 0854473 | 1/1998 |
| IE | 000820 | 5/2002 |
| JP | 60 165781 | 8/1985 |
| JP | 60 263490 | 12/1985 |
| JP | 61156894 | 7/1986 |
| WO | WO 01/22543 | 3/2001 |

OTHER PUBLICATIONS

Coldren, L.A. et al., "Monolitic two-section GaInAsP/InP active-optical-resonator devices formed by reactive ion etching" Appl. Phys. Letters, vol. 39, No. 5 (Mar. 1981).
Corbett, B., Et Ali., "Single longitudinal mode ridge waveguide 1.3um Fabry-Perot laser by modal perturbation" Electronics Letters, vol. 31, No. 25, (Dec. 7, 1995).

(Continued)

*Primary Examiner*—Dung T Nguyen
(74) *Attorney, Agent, or Firm*—Brooks, Cameron & Huebsch PLLC

(57) ABSTRACT

Disclosed is a laser (10) comprising a lasing cavity with a lasing medium and primary optical feedback means in the form of a facet (17) at either end of the cavity, the laser cavity defining a longitudinally extending optical path; and secondary optical feedback means formed by a plurality of refractive index perturbations (16, 22) in the laser cavity, each perturbation defining two interfaces (20, 21); characterized in that, for at least one perturbation, only one of the two interfaces contributes to optical feedback along the optical path. The present invention relaxes the lithographic tolerances for making single longitudinal mode devices and improves performance characteristics.

19 Claims, 20 Drawing Sheets

OTHER PUBLICATIONS

Ebeling, K.J., et al., "Single-mode operation of coupled-cavity GailAsp/InP semiconductor laser", App. Phys. Letters, vol. 42, No. 1 (1983).

Ebeling, K.J., et al., "Tunable single-longitudinal mode emission of semiconductor lasers," Journal of Optical Communications, vol. 18, No. 4, (Sep. 16, 1984).

McDonald, David, et al., "Performance Characteristics of Quasi-Single Longitudinal-Mode Fabry-Perot Lasers," IEEE Photonics Technology Letters, vol. 8, No. 9 (Sep. 1996).

Minghuang, Hong J., Eta L., Molecular-Beam-Epitaxy-Grown Single-Lingitudinal-Mode GaAs-AlGaAs Interferometric Lasers . . . , Electronics Letters, Vo. 21, No. 24 (Nov. 1985).

Zhou, X., et al., "Deriving Expression of Output Spectrum from Semiconductor Laser with Two Sub-cavities," J. Optical Comm., vol. 18, No. 4 (1997).

International Search Report PCT/IE2004/000091 (4 pgs.).

International Search Report PCT/EP2005/053392 (3 pgs.).

\* cited by examiner

PRIOR ART

PRIOR ART

Form Resist Pattern

Etch Ridge/Slot Features

Deposit dielectric Coating

Open Dielectric Coating above Ridge

Deposit contact metal

SEMICONDUCTOR LASER AND METHOD OF MANUFACTURE

FIELD OF THE INVENTION

The present invention relates a semiconductor laser, in particular such a laser which operates with substantially single longitudinal mode emission.

BACKGROUND

Achieving single mode emission by introducing perturbations at prescribed positions along the length of a device is known, see EP 1 214 763 (Trinity College Dublin) the contents of which are incorporated herein by reference. So called "slotted lasers", which achieve single longitudinal mode emission by means of optical feedback resulting from the etching of slot features along the laser cavity, are also disclosed in Irish Patent No S82521 (National University of Ireland, Cork).

In general terms, the perturbations may be caused by any index altering means which modifies the refractive index profile of the waveguide to an appropriate degree to manipulate optical feedback and hence the spectral content of the device. While the description of the present invention which follows refers primarily to the case where the perturbations are defined by slots etched along the device it will be appreciated by a person skilled in the art that the teaching of the invention is equally applicable to other forms of perturbations (for example modifying the refractive index profile by employing doping or ion implantation methods).

The term 'slot length' (designated $L_{slot}$ in FIG. 1) as used herein refers to the distance between the longitudinal slot faces in the device material, ie 'slot length' is measured along the direction of light propagation, d. FIGS. 1 and 2 illustrate a typical prior art slotted laser 1 having a single rectangular slot 6. Typically such a device comprises waveguiding layers 2 (containing for example a multiple quantum well structure) covered by an upper cladding layer 4. Primary optical feedback means are provided in the form of a cleaved facet 8 at either end of the device. The distance between the facets determines the exact wavelengh's of the Fabry Perot modes of the cavity. The upper cladding layer 4 forms a ridge 3 having a cap layer 5. The slot features in such known devices are formed by etching a rectangular slot 6 in the ridge waveguide 3, resulting in two longitudinal interfaces 7 that are perpendicular to the direction of light propagation, d, within the device.

The mechanism where by slotted lasers achieve their single mode performance may be described as follows:

It is well known that the free spectral range of a laser is given by $$\Delta\lambda = \frac{\lambda^2}{2n_{eff}L} \quad (1)$$

and as such is in effect determined by the cavity length, L, of the device. Where, $\Delta\lambda$, is the free spectral range, $\lambda$, is the free space wavelength of the light and, $n_{eff}$, is the effective index of the optical mode in the laser cavity. However it is observed that by placing reflective interfaces in the laser cavity at intervals separated L/N it is possible to discriminate against all but every $N_{th}$ Fabry Perot mode (ie to enhance approximately every $N_{th}$ mode). Where L is again the cavity length of the laser and N is an integer. This is essentially what occurs in a slotted laser, except for the fact that when a rectangular slot feature is etched into a laser cavity, two reflective interfaces are created simultaneously. What is important to note here is that each of the reflective interfaces created provides a similar amount of optical feedback. It is also important to realise that the length of the etched slot features must be kept reasonably small (typically <3 μm). The principal reasons for this are the following: Firstly, the internal loss in the waveguide beneath slots is substantially higher that elsewhere in the cavity. Secondly, since the dopant concentration in the semiconductor material below the bottom of a slot may be less than one tenth of that in the cap layer it is impossible to create a low resistance metal contact on this material. This means that if the length of a slot feature is increased arbitrarily, then a portion of material beneath the slot will remain unpumped.

In order to accurately specify the emission wavelength of a device it is necessary to be able to position all the edges of the slot features relative to each other with an accuracy that is inversely proportional to the distance between them. This can be understood by recognising that the standing wave conditions in a long cavity device are less effected by a fixed change in the length of the cavity, $\Delta x$, than the standing wave conditions in a short cavity device. (It is noted that since the facets of a device provide a significant amount of optical feedback, the positioning of these interfaces with respect to the slot features is important). As typical slotted lasers incorporate etched features, the length's of which are less than an order of magnitude greater than the wavelength of the optical field in the laser cavity. Also given that the two interfaces of a given conventional slot feature provide a significant amount of optical feedback, then it can be appreciated that the emission wavelengths, or more precisely the mirror loss spectra of such devices, are extremely sensitive to errors in the distance between the interfaces of such a feature. The emission wavelength of a slotted laser is thus critically dependent on length of the slot features themselves. The process of accurately realising a slot feature of a given length is therefore also important.

The most important factor in determining the accuracy with which a slot feature can be implemented is the choice of lithographic technique used. This varies between +/-10-20 nm for e-beam systems to +/-100-200 nm optical lithography systems. Beyond the accuracy of the lithographic system itself, the procedure of realising a rectangular slot feature of a certain length is also severely hampered by the bias associated with etching process (the offset due to process bias is designated $O_{pb}$ in FIG. 3). This is a problem because the length of a slot feature with parallel edges is affected by the bias of the etching process and therefore the critical dimensions in the slot pattern may be changed. As a result of these factors it is difficult, using standard lithographic and processing techniques, to sufficiently control the length of a rectangular slot feature and thus specify the spectral content of a device containing such features.

As discussed above there are considerable difficulties in accurately specifying the emission wavelength of slotted lasers. It is an object of the present invention to address these difficulties.

It is a further object of the invention to provide manufacturing method, which addresses the problems, associated with processing bias and the resulting effect on slot positioning.

It is a still further object to provide a substantially single mode laser whose performance is less temperature dependent.

It is another object of the invention to provide a method of enhancing the free spectral range of a laser and to provide a laser having improved free spectral range.

BRIEF DESCRIPTION OF THE INVENTION

The present invention provides a laser emitting light of substantially a single wavelength, comprising a lasing cavity with a lasing medium and primary optical feedback means in the form of a facet at either end of the cavity, the laser cavity defining a longitudinally extending optical path; and secondary optical feedback means formed by one or more effective refractive index perturbations in the lasing cavity, each perturbation defining two interfaces; wherein for at least one perturbation, only one of the two interfaces contributes to optical feedback along the optical path.

Preferably the laser comprises a ridge and at least one effective refractive index perturbation is formed by a slot defined in the ridge. In a preferred embodiment each perturbation comprises a slot formed along the ridge.

It is preferred that the contributing interface of each perturbation is substantially planar and substantially perpendicular to the longitudinally extending optical path.

Preferably at least one slot comprises a first face which is substantially planar and substantially perpendicular to the longitudinally extending optical path and a second face which is non-perpendicular to the optical path and is preferably substantially stepped, curved or angled with respect to the first face. Such slot design minimises or prevents destructive interference between interfaces.

According to the invention only the interfaces which are substantially perpendicular to the optical path contribute to optical feedback within the device, with feedback from non-perpendicular interfaces being suppressed thus improving performance characteristics of the laser.

In an alternative embodiment a laser comprising a ridge has at least one effective refractive index perturbation is formed by one or more indentations defined in the side of the ridge. Suitably each perturbation may be formed by indentations defined in the ridge.

Typically a series of effective refractive index perturbations may be employed wherein the spacing between adjacent contributing interfaces is a uniform number of quarter or half material wavelengths. One or more additional series of effective refractive index perturbations may be overlaid with a first series of perturbations. Such series of perturbations result in devices with a larger effective free spectral range.

In a further embodiment two or more slots are of different length (while the spacing between adjacent contributing faces is a uniform number of half wavelengths). The effect of such 'chirped' slots is that the contributing faces can result in constructive interference of the optical feedback within the cavity whereas the non-contributing faces do not since the lengths of individual slots are different from each other.

The present invention also relates to a method of manufacturing a laser comprising the steps of: (1) forming a laser cavity with a lasing medium, the laser cavity defining a longitudinally extending optical path and having a facet at either end, and (2) forming optical feedback means by introducing a plurality of perturbations into the laser cavity, each perturbation defining two longitudinal interfaces; characterised in that, the longitudinal interfaces of at least one perturbation are adapted such that only one interface contributes to optical feedback along the longitudinally extending optical path. That is to say that, for at least one perturbation, only one interface contributes to optical feedback along the longitudinally extending optical path.

Preferably the cavity is formed with a longitudinally extending ridge and at least one perturbation is provided by etching a slot in the ridge.

Preferably at least one slot is formed with a first face which is substantially planar and substantially perpendicular to the longitudinally extending optical path and a second face which is non-perpendicular to the optical path and is preferably substantially curved, stepped or angled with respect to the first face. Alternatively perturbations may be provided by etching one or more indentations in the side of the ridge.

The method of the invention improves processing tolerances and enhances temperature characteristics of the resultant laser as shall be described further below.

The invention also provides a method of enhancing the free spectral range of a laser device comprising forming a series of effective refractive index perturbations along the optical path wherein the spacing between adjacent contributing interfaces is a uniform number of quarter or half material wavelengths.

DESCRIPTION OF THE DRAWINGS

The invention is described in further detail below with reference to the accompanying drawings in which.

DETAILED DESCRIPTION OF THE INVENTION

Figure 1:
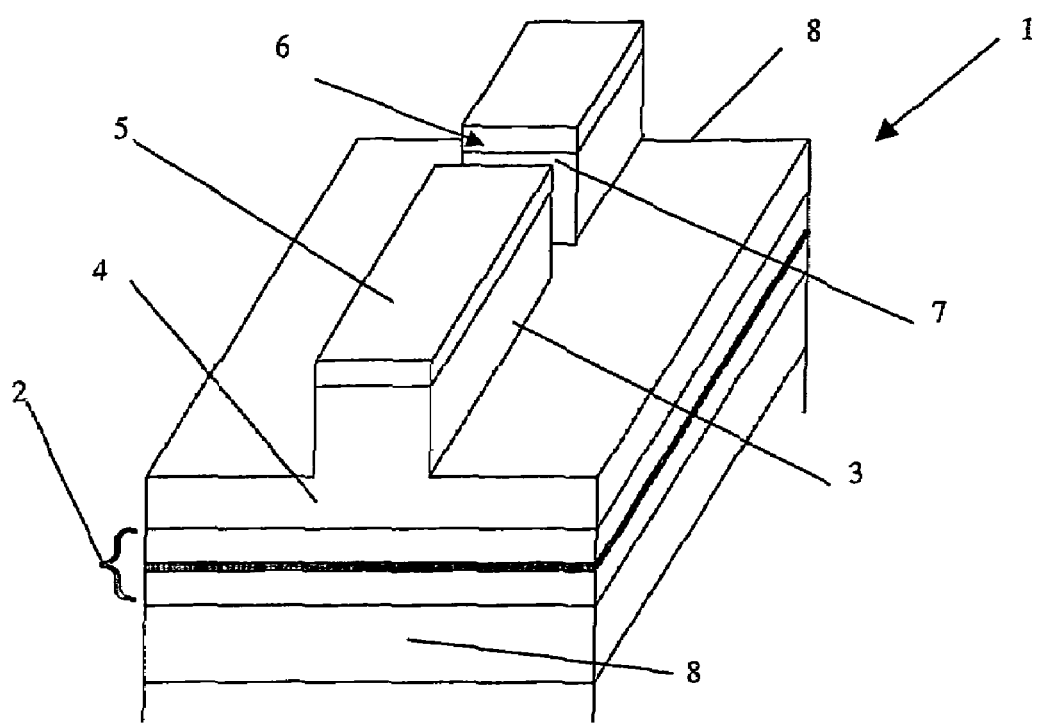
FIG. 1 illustrates a prior art slotted laser device comprising a single rectangular slot feature.
Figure 2:
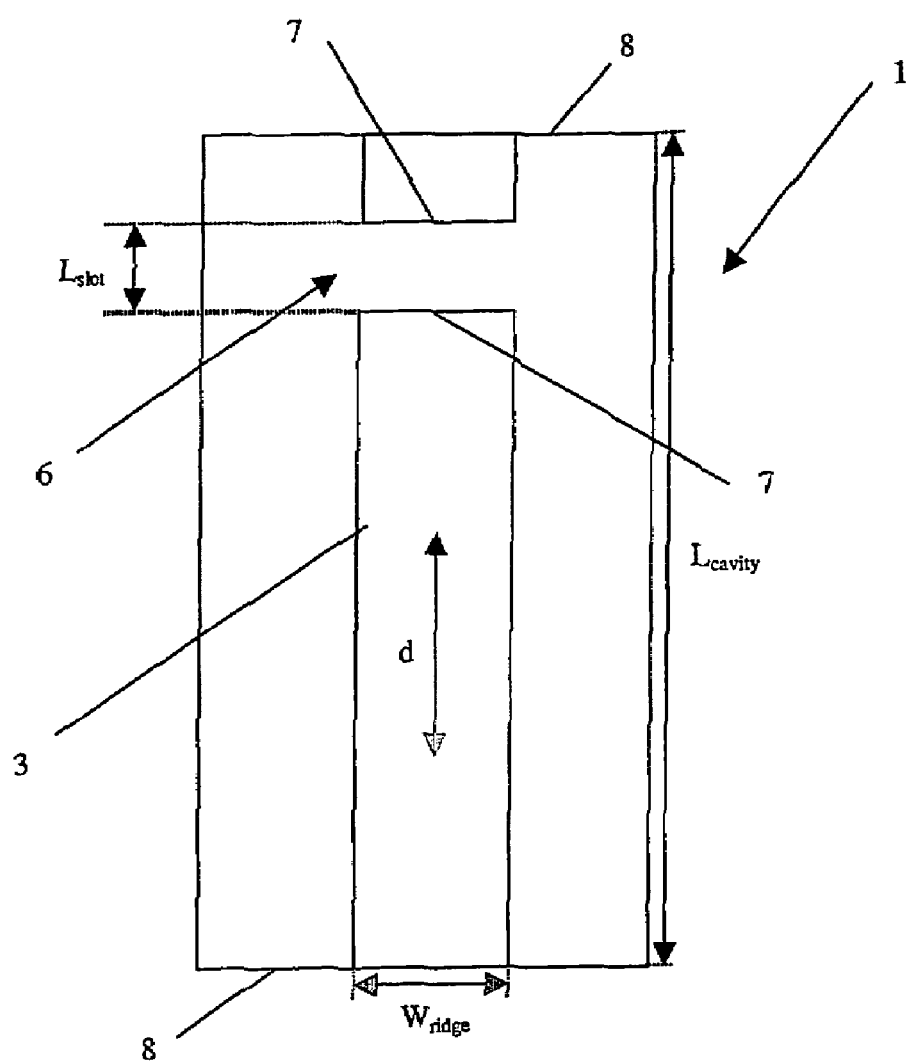
FIG. 2 is a plan view of the prior art structure shown in FIG. 1.
Figure 3:
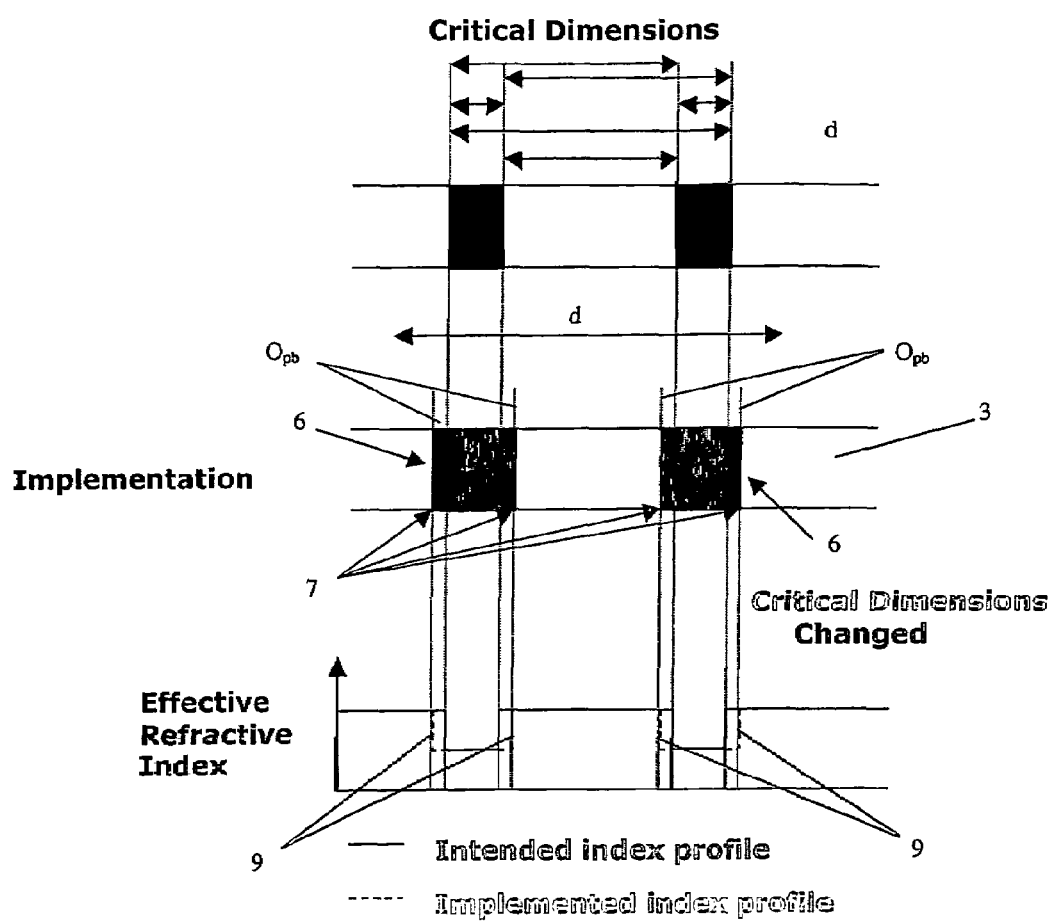
FIG. 3 is a schematic representation of the effects of the processing bias on the positioning of rectangular slots within a prior art device.

Known slotted lasers suffer from the problems discussed above. These problems stem from the fact that prior art slot patterns form pairs of contributing interfaces (or interfaces providing feedback) separated by very small distances (typically <3 µm) as illustrated in FIG. 3. FIGS. 1 and 2 show a prior art device 1 formed of waveguiding layers 2 (typically having a multiple quantum well structure), upper cladding layer 4 and cap layer 5 with a facet 8 at either end. A ridge 3 extends longitudinally along the top of the device 1. One rectangular slot feature 6 is shown etched in the ridge 3 giving rise to slot faces 7 which are substantially perpendicular to the longitudinal direction of light propagation within the device. FIG. 3 illustrates how, as a result of offset due to process bias, the contributing interfaces 9 defined by faces 7 of rectangular slot 6 cannot be properly positioned with respect to other such contributing interfaces in the laser cavity with an accuracy high enough to ensure constructive interference at the appropriate wavelength. Specifically, in the case of such rectangular slots, each face of the slot will contribute to the overall optical feedback. The present invention reduces the optical feedback provided by the interfaces on a particular side of a given number of slots to such an extent that they can be ignored. This approach thus allows greater control of the lasers spectral content.

Where the length of a slot is constrained by the factors outlined above, any change in slot length will have profound effects on the mirror loss spectrum and thus emission wavelength of the device. As a result of the present invention this is no longer a problem since the spectral selectivity of the slot features is now no longer dependent upon the size of the slots themselves. The only dimensions which remain critical are the distances between those interfaces which provide a significant amount of optical feedback. Since these dimensions are typically more than an order of magnitude greater than the length of the slots themselves the accuracy with which these features have to be positioned is also relaxed by more than an order of magnitude.

Figure 4:
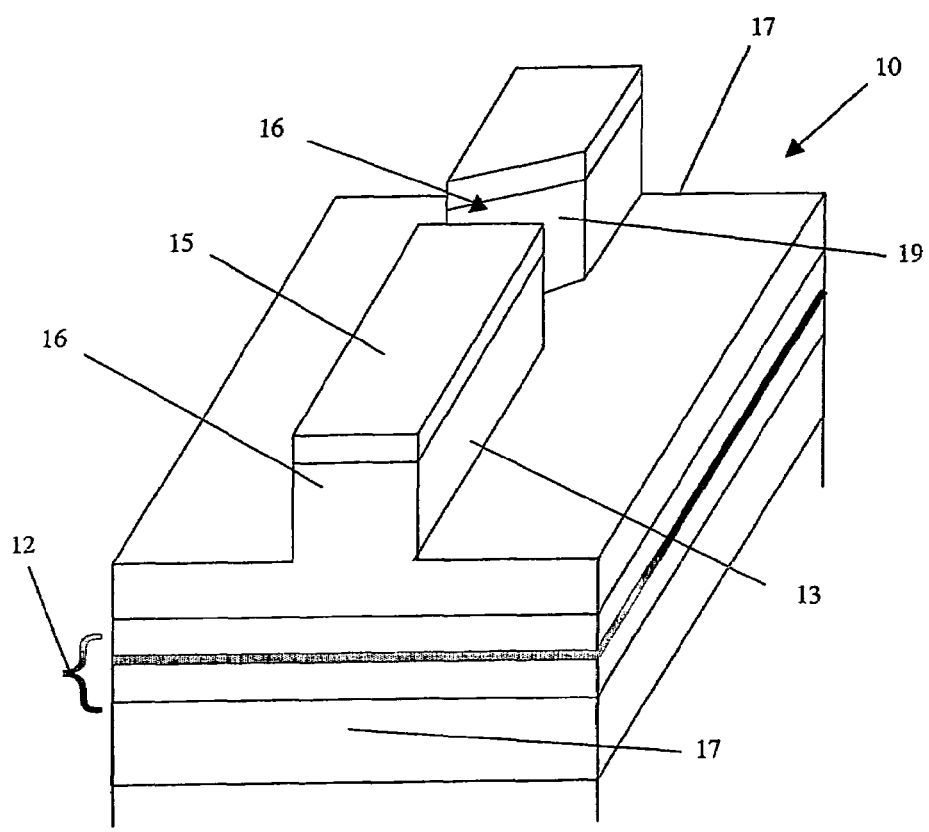
FIG. 4 shows a slotted laser device comprising a single angled slot.
Figure 5:
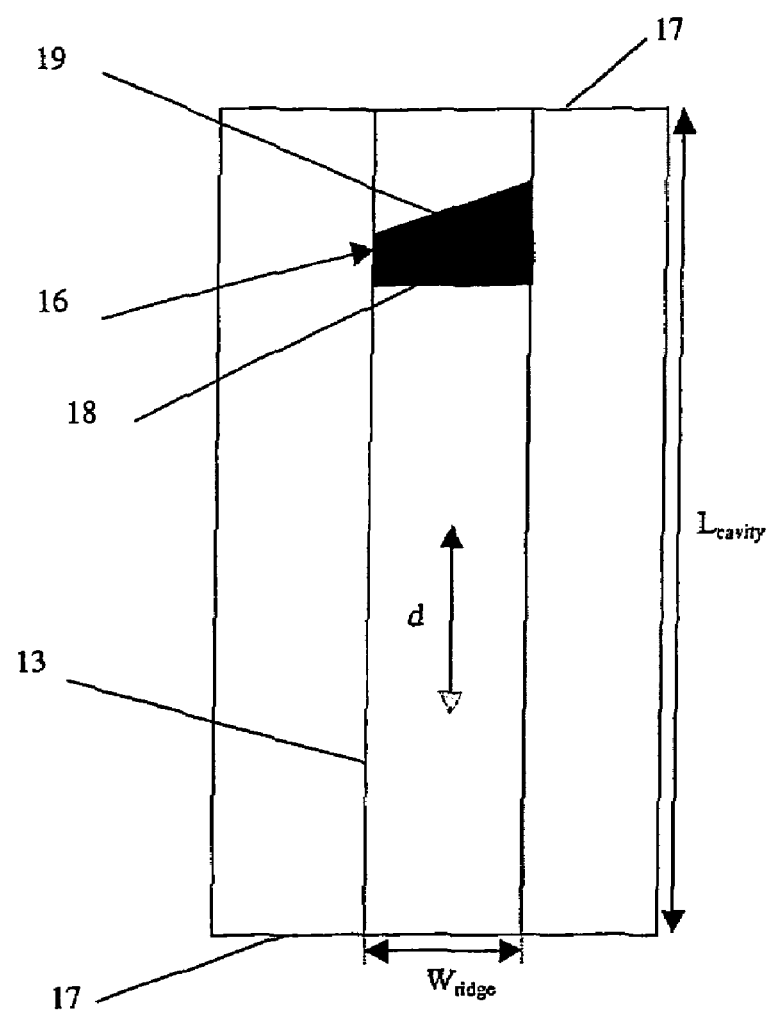
FIG. 5 is a plan view of the device shown in FIG. 4.

FIGS. 4 and 5 show a device 10 according to the invention (having a similar structure to the device 1 in FIG. 1) with waveguiding layers 12, upper cladding layer 14, cap layer 15, ridge 13 and facets 17. In the embodiment shown an angled slot feature 16 is formed having a first face 18 perpendicular to the light propagation directions and a second face 19 angled with respect to the first face 18. The introduction of one or more slots (or equivalent features) causes perturbation of the lasing medium which is reflected in the change in refractive index profile (see FIG. 6). Interface 20 defined by an abrupt change in effective refractive index will contribute to optical feedback along the optical path, while interface 21 will not.

Figure 6:
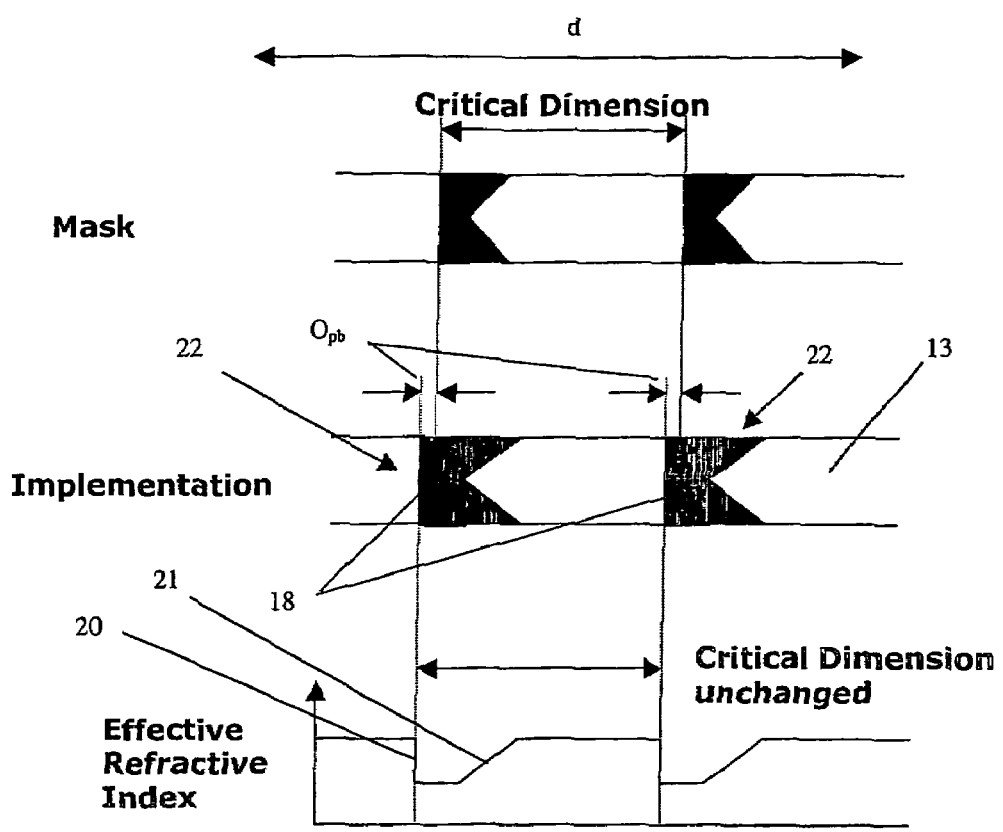
FIG. 6 illustrates the critical dimensions in a laser according to the invention incorporating angled slot features and the effect on the refractive index caused by introducing angled slots.

Considering FIGS. 3 and 6 and the problem of the bias associated with the etching process, it becomes apparent that with the present invention this is no longer an issue, since the length of the slot feature has now no bearing on the spectral distribution of the mirror loss spectrum of the device and thus no bearing on its emission wavelength. Moreover, if the interfaces which provide the bulk of optical feedback are all provided on same side of the slot features it is clear that process bias will effect all these interfaces in the same way, as shown in FIG. 6, thus having a reduced effect on the critical dimensions. Essentially, the present invention allows for lithographic tolerances to be relaxed when making single longitudinal mode devices at specified wavelengths. It also allows the emission wavelengths of adjacent laser elements in a bar format to be positioned precisely respect to each other. Moreover it allows this to done exactly with more relaxed lithographic tolerances than could be employed in the fabrication of known slotted lasers incorporating rectangular etched features.

The invention is based on the premise that structural features (such as slots, doped regions or the like) can be used to modify the effective refractive index profile of a device. (The effective refractive index is obtained by summing the products of the refractive index in a particular region of the laser cavity and the fraction of the optical intensity which is present in that region, and dividing this value by the integral over the spatial extent of the optical field.) Such structural features cause perturbation of the refractive index profile within the device, thus influencing performance characteristics. In other words, the faces of a slot etched in the ridge of a laser such as that shown in FIG. 4 cause interfaces between regions of higher and lower refractive index—the interfaces being defined by the physical characteristics of the slot. The present invention enables the performance characteristics of a laser to be enhanced by employing slot designs that perturb the refractive index profile so that there is only one contributing interface associated with each slot. In contrast rectangular slot features employed in prior art devices have two contributing interfaces associated with each slot.

Different types of etched features, which fulfill the requirement of providing only one contributing interface, are discussed below. Also discussed below are example patterns of such features that enable single longitudinal emission at a specified wavelength over an extended temperature range. It is noted that the patterns and their constituent etched features can be used interchangeably to achieve the desired spectral content.

As previously mentioned each slot pattern has two distinct design elements associated with it, the first is shape of etched slot features the second is positions of these features with respect to one another and the facets of the laser cavity. In general any slot configuration in which optical feedback from one of the slot interfaces is suppressed may be employed in the present invention. For the purpose of the invention therefore a slot should produce a refractive index profile such as that shown in FIG. 6 having a first contributing interface 20 and a second non-contributing interface 21. In the case of the non-contributing interface 21, the desired refractive index effect may be produced by the introduction of an angled, sloped, stepped, curved (or combination thereof) or other suitable slot into the ridge 13. FIG. 6 depicts slots 22 each having a conventional planar face 18 and a 'v-shaped' face 22. Any other effect upon refractive index which has the result that the second interface does not contribute substantially to optical feedback within the along the longitudinal optical path will suffice for the purposes of the invention. The key aspect of the present invention is therefore that the refractive index profile associated with at least one perturbation or slot is such that only one of the two longitudinal interfaces contributes to optical feedback.

Figure 7:
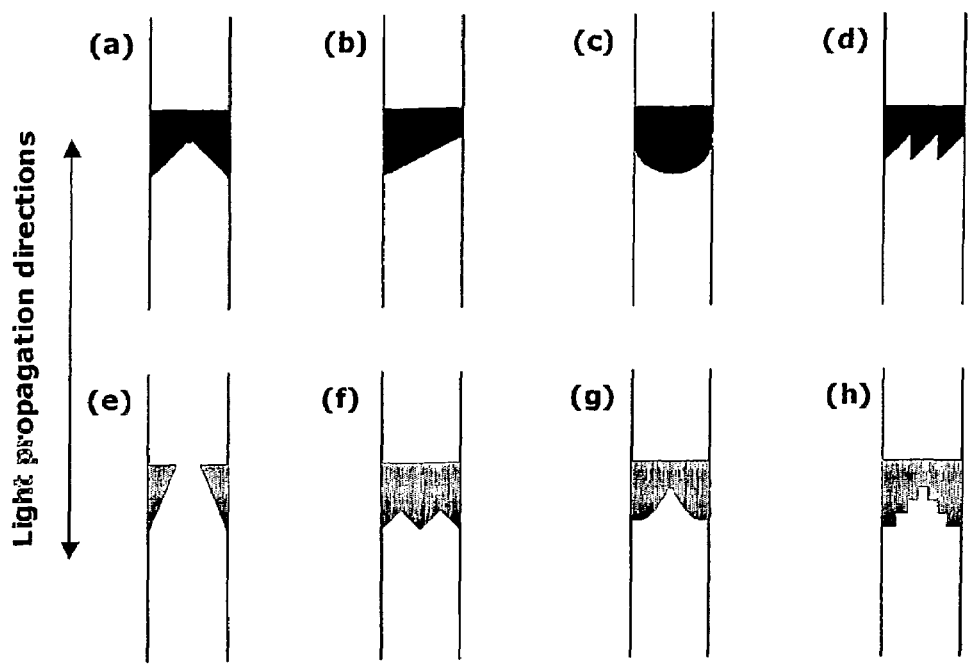
FIG. 7 illustrates examples of different slot configurations, which may be used in the present invention.

FIG. 7 illustrates examples of different slot configurations, which may be used in the present invention, specifically the slot features (a) and (e) are referred to as being tapered, the features (c) and (g) are referred to as being curved, the features (d) and (f) are referred to as being corrugated, feature (b) is referred to as being angled and the feature (h) is referred to as being stepped tapered. The common trait being that they each have one interface which is substantially perpendicular to the direction of light propagation in the laser cavity (contributing to optical feedback), while the other side of the slot is designed to suppress optical feedback (eg by being curved or angled with respect to the first interface). The selection of devices shown in FIG. 7 is not an attempt to provide a comprehensive set of designs instead it merely illustrates a number of possible implementations.

Preferably each slot defines a first interface (or contributing interface) which is substantially planar and substantially perpendicular to the longitudinally extending optical path and a second interface (or feedback suppressing interface) which is substantially curved or angled with respect to the first interface. The contributing interface acts in the usual manner to provide optical feedback to $L/N^{th}$ modes while the suppressing interface is designed to avoid adding to the optical feedback within the laser cavity. Having the second interface curved or angled with respect to the first reduces the amount of optical feedback it can provide to any particular longitudinal mode for two reasons. Firstly, light which interacts with a curved or angled interface is more likely (than light interacting with a planar interface aligned perpendicular to its direction of propagation) to be scattered out of the laser cavity. Secondly, light which is reflected back into lasing mode from different parts of such an interface will not be in phase, thus the optical feedback it provides will be distributed over a wavelength range which encompasses a number of longitudinal modes of the laser cavity thus diluting its impact in determining spectral content.

Specifying the emission wavelength of a laser diode, by etching features discussed above can be achieved by placing the interfaces which provide the bulk of the optical feedback, i.e. the straight interfaces which are perpendicular to the direction of light propagation, at distances from one another that correspond to multiples of half the free space emission wavelength divided by effective refractive index of the lasing mode. At this juncture it is worth defining $\lambda_m$ which is the wavelength of light in the laser cavity, this is also known as the material wavelength. The material wavelength is related to the free space wavelength, $\lambda$, by the following equation $$\lambda_m = \frac{\lambda}{n_{eff}} \quad (2)$$

The problem of achieving single longitudinal mode laser emission at a specified wavelength over a particular temperature range is also addressed by the present invention. In order to do this it is necessary to discriminate against enough of the longitudinal modes of cavity to cope with changes in the laser's gain spectrum that occur over the temperature interval in question. Once the number of longitudinal modes (of the unperturbed structure) which must be discriminated against for a particular application is determined the appropriate slot pattern can be determined. For the most basic type of slot patterns, i.e. those in which all contributing interfaces providing the bulk of the optical feedback are separated by the same distance, the effective free spectral range, $\Delta\lambda_{eff}$, can be calculated from the formula $$\Delta\lambda_{eff} = \frac{d}{L}\Delta\lambda \quad (3)$$

(where d is the distance between the contributing interfaces of the slot features, L is the cavity length, and $\Delta\lambda$ is the free spectral range of the Fabry Perot cavity).

Figure 8:
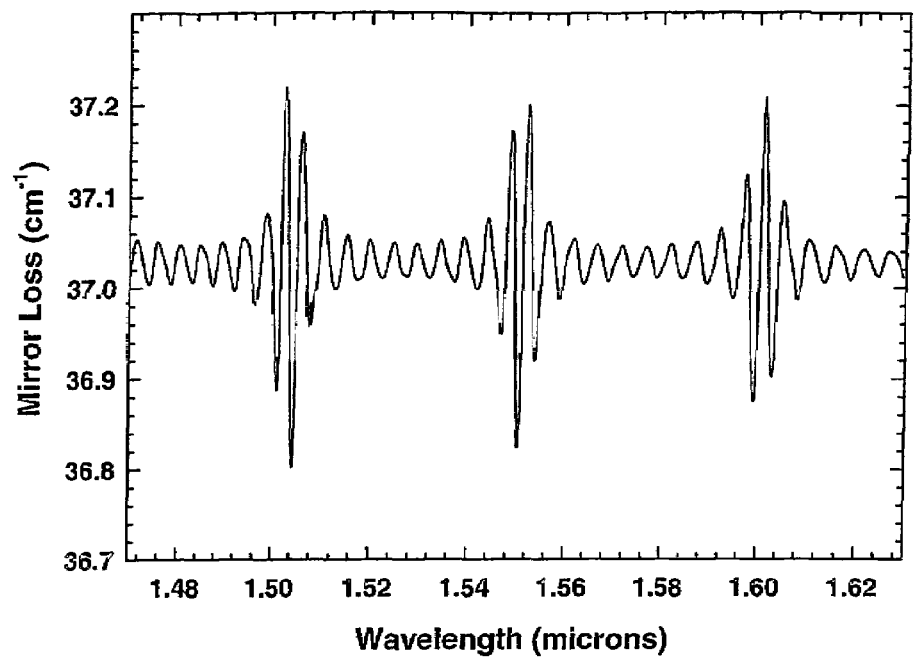
FIG. 8 is the calculated mirror loss spectrum for a device incorporating angled slot features separated by 32 appropriate half material wavelengths to achieve single mode emission at 1.55 μm.

The two aspects of spectral selectivity discussed thus far i.e. the ability to specify the wavelength and the extent of the effective free spectral range, are clearly evident in FIG. 8 which shows the calculated mirror loss spectrum of one embodiment of the invention, a device which has ten etched tapered slot features. These features are positioned along the cavity so as to produce lasing emission at 1.55 µm, as such their high feedback interfaces were separated by a distance of sixteen material wavelengths. Since lasing emission occurs at wavelengths which correspond to minima in the mirror loss spectrum it is immediately apparent that the effective free spectral range of this laser is 45 nm, assuming the gain spectrum is sufficiently flat, this is the same value as that obtained using Equation 3. It is also apparent that a laser diode whose gain spectrum is centred close to 1.55 µm, and which incorporates this pattern, will lapse in a single longitudinal mode at 1.55 µm. Given that the gain spectrum of the active region in such devices tunes with temperature at a rate of approximately 0.6 nm/° C. such a device incorporating the pattern of slot features discussed would provide single longitudinal mode emission over a temperature range of $T_1+/-T_3$ (where $T_1$ is the temperature at which the gain spectrum is centred around the wavelength of interest, and $T_2$ is by $$T_2 = \frac{\Delta\lambda_{eff}/2}{dG/dT} \quad (4)$$

where dG/dT is the rate at which the gain peak tunes with temperature). In this case it is possible to achieve single longitudinal mode emission over a temperature interval of about 80° C.

Figure 9:
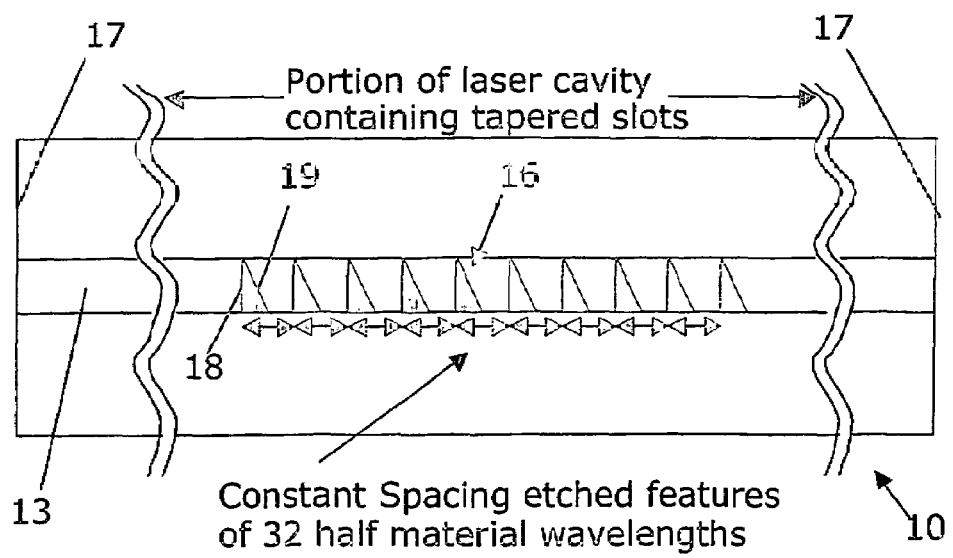
FIG. 9 illustrates the angled slot pattern used to obtain the calculated mirror loss spectrum shown in FIG. 8.
Figure 10:
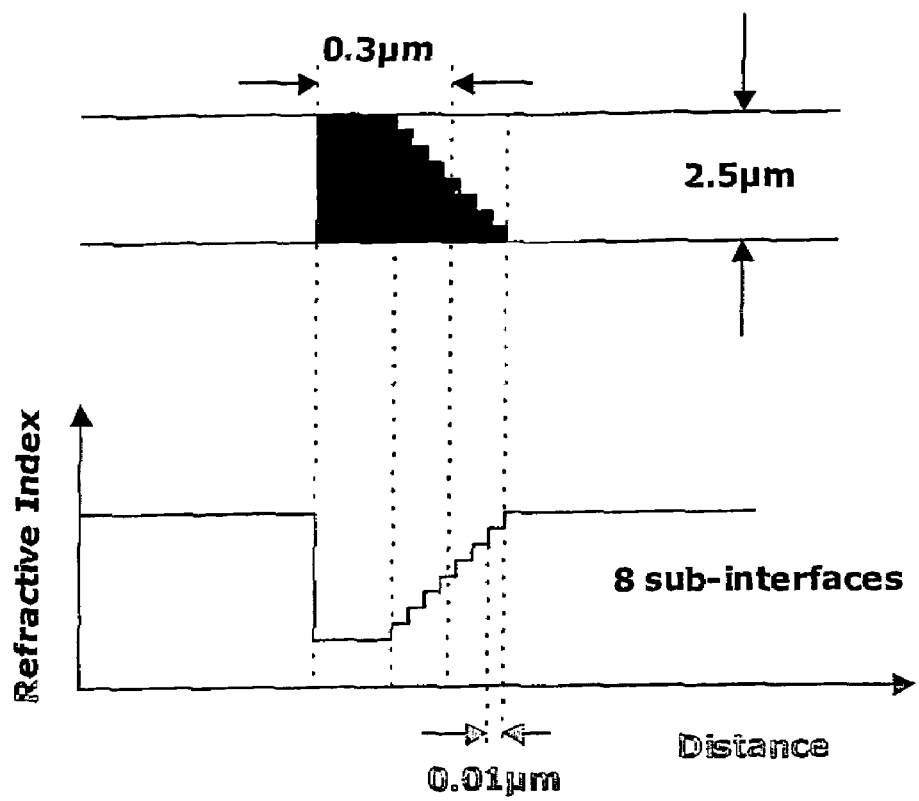
FIG. 10 illustrates in more detail the slot feature used in the simulations which produced the calculated mirror profiles in FIGS. 8, 11 and 12.

FIG. 9 illustrates the positions these slot features in the laser cavity. The slot features themselves have an average length of 0.3 µm, their associated contributing interfaces having an effective refractive index step of 0.008, while the angled face of each slot feature consisted of eight sub-units each providing an effective index step of 0.001, and staggered along the cavity by about 10 nm (see FIG. 10). The portion of the laser cavity containing the tapered slots is characterised by a series of slots etched at constant spacing of 32 half material wavelengths.

Figure 11:
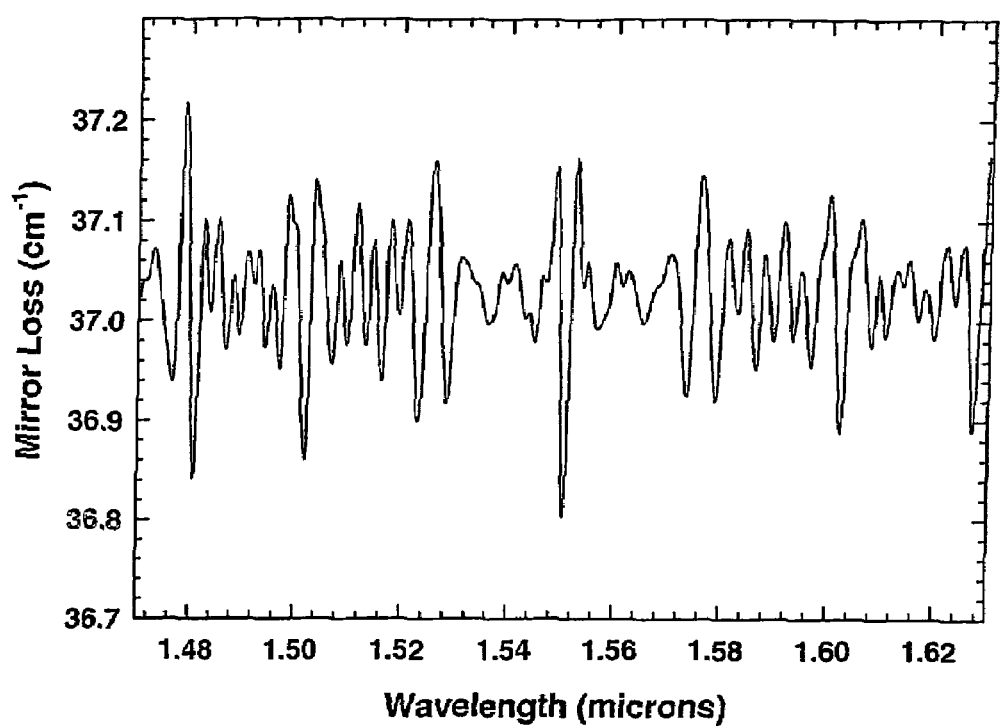
FIG. 11 is a calculated mirror loss spectrum obtained using a slot pattern in which the angled features are separated by different numbers of half material wavelengths, the slot pattern in question being designed to achieve single mode emission at 1.55 μm (note the very large effective free spectral range)
Figure 12:
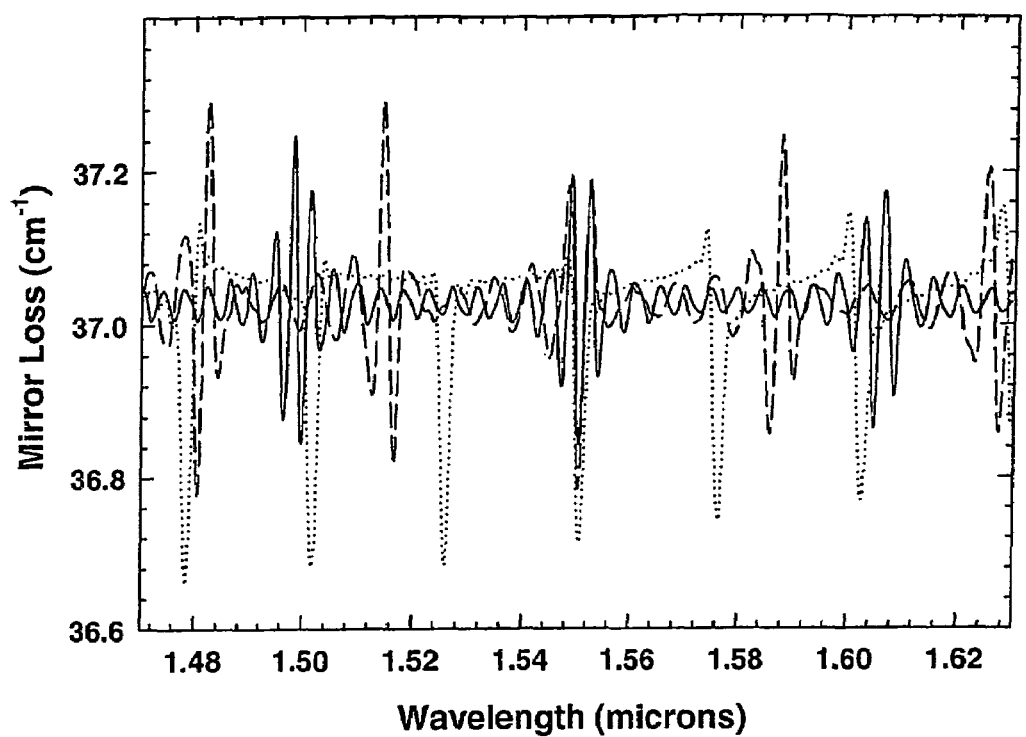
FIG. 12 consists of three overlaid calculated mirror loss spectra from 3 different slot patterns all designed to obtain single longitudinal mode emission at 1.55 μm (the solid, dashed and dotted spectra were respectively obtained using patterns in which the angled slot features were separated by 29, 44 and 62 half material wavelengths)
Figure 13:
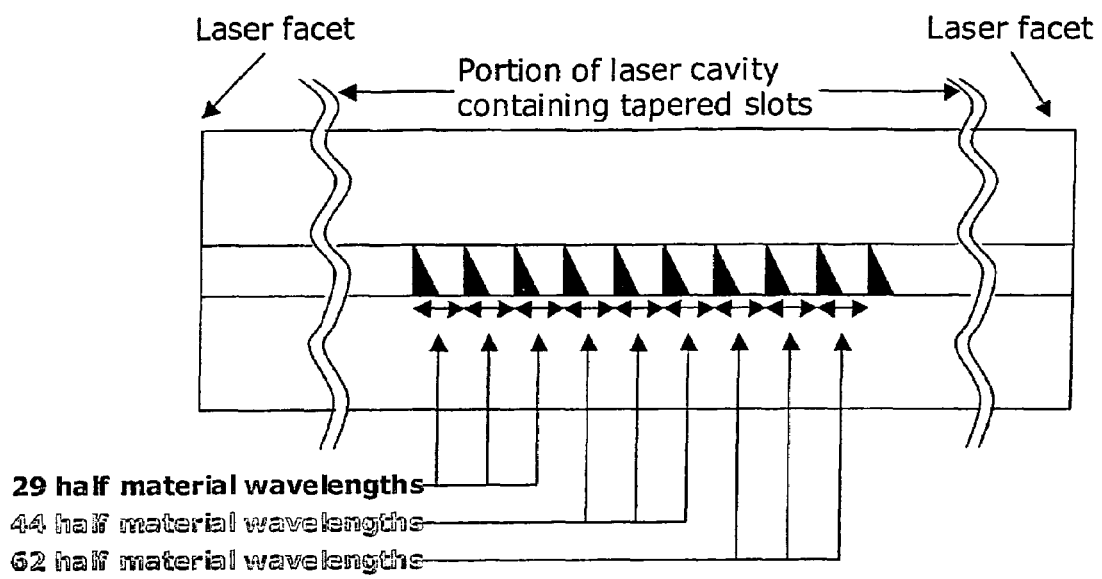
FIG. 13 illustrates an angled slot pattern used in calculation of the mirror loss spectra shown in FIG. 11.
Figure 14A:
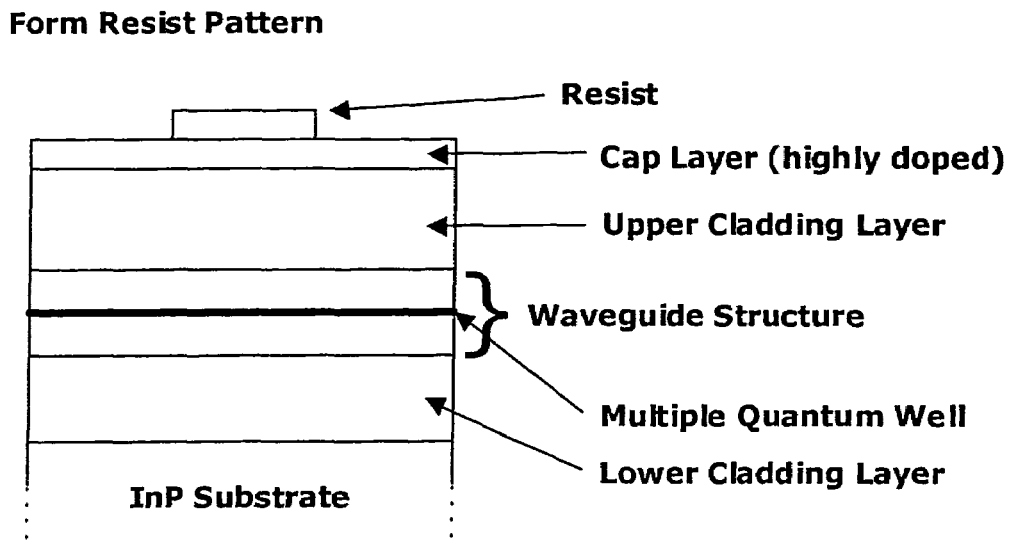
FIG. 14 (a-e) shows side profile views of a device at various stages in the fabrication process.
Figure 14B:
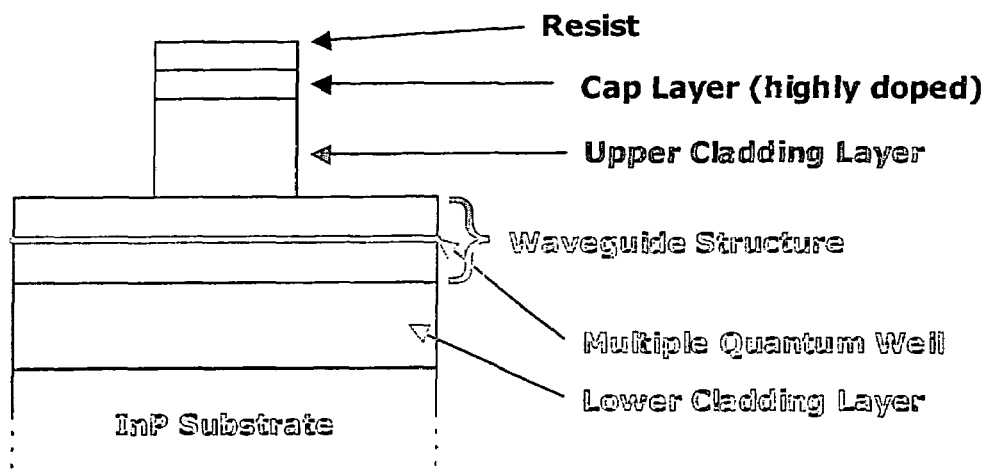
Figure 14C:
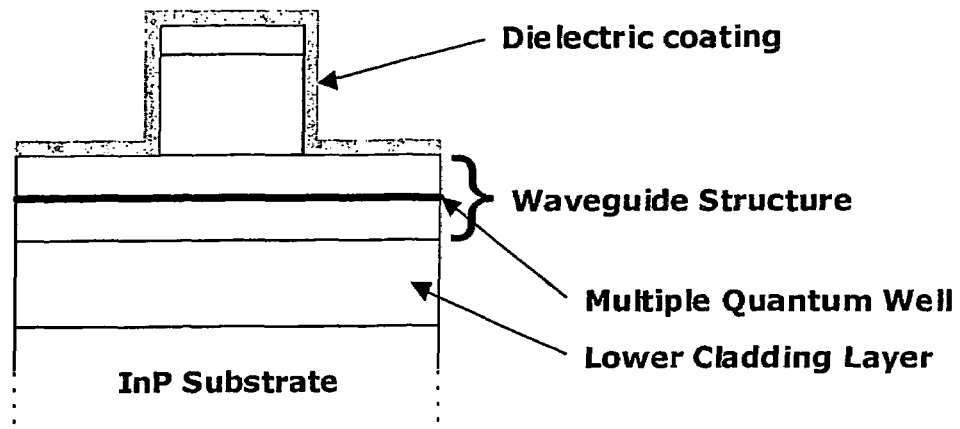
Figure 14D:
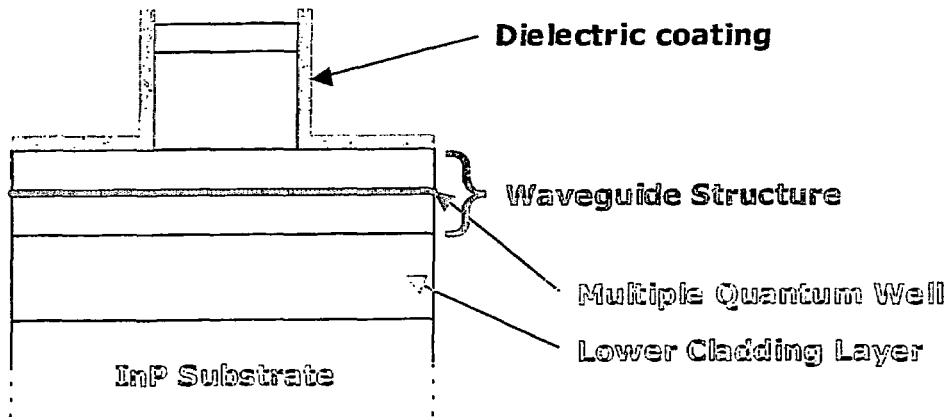
Figure 14E:
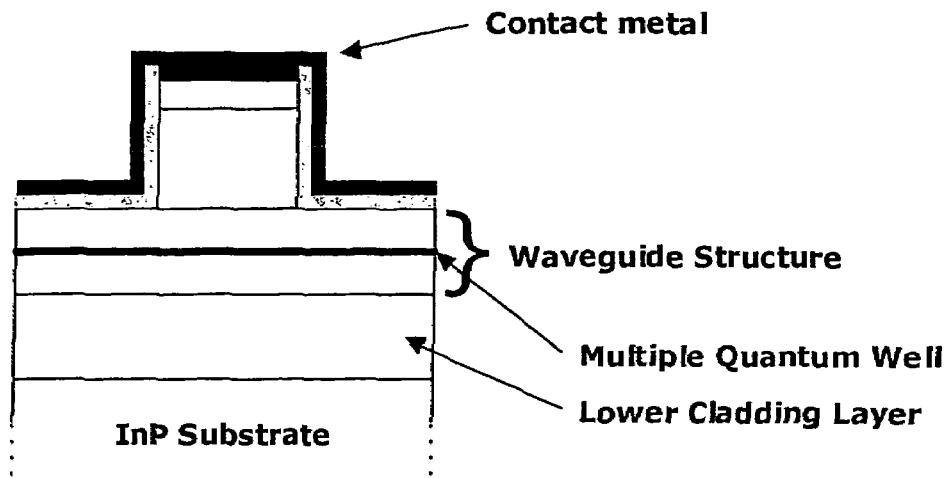

FIG. 11 is the calculated mirror loss spectrum for a device according to a second embodiment comprising a different pattern of ten tapered slot features (see FIG. 13). This embodiment exhibits a greater effective free spectral range and therefore will maintain single longitudinal emission over far greater temperature ranges. Specifically the effective free spectral range is greater than 80 nm, this would provide signal longitudinal mode emission over a temperature range about 160° C. Before considering the details of the pattern of etch features, which has the mirror spectrum shown in FIG. 11 it is worth considering the following: FIG. 12 shows the mirror loss spectra for three simple slot patterns analogous to that shown in FIG. 9, all designed to obtain single longitudinal mode at the same wavelength, in this specific case the wavelength in question in 1.55 μm. With respect to the patterns of tapered slot features which have the mirror loss spectra shown in FIG. 12 it is important to note that they differ only by virtue of the fact that their perpendicular planar faces are separated by different numbers of half material wavelengths. It can be seen that the only wavelength at which these patterns constructively interfere is the wavelength at which they are designed to lase at, i.e. 1.55 μm. Thus the effective free spectral range is enhanced by combining patterns of slot features (that have different number of half material wavelengths between the slot faces defining the feedback contributing interfaces). Such an approach smears out the parts of the mirror loss spectrum on each side of the wavelength of interest that are highly oscillatory, creating a more uniform mirror loss spectrum except at the wavelength of interest.

The slot pattern (FIG. 13) which was used to obtain the mirror loss spectra in FIG. 11 can be thought of as a combination of the three patterns which were used to produce the various mirror loss spectra found in FIG. 12 ie three individual series having slot separations of 29, 44 and 62 half material wavelengths. As the only wavelength at which this combination of patterns constructively interferes is the design wavelength, the result is an enhanced effective free spectral range. This approach offers an improvement over simpler slot patterns, which consist of just one fixed number of half material wavelengths between adjacent slot faces defining the contributing interfaces.

A number of laser diode devices incorporating various configurations of tapered slot features were fabricated. These devices were fabricated using standard processing techniques. The steps used in the manufacture of the devices, whose characteristics are detailed here, were as follows.

(1) Growth of a standard AlInGaAs/InP epitaxial laser diode structure on an InP substrate;
(2) Formation of a resist pattern for ridge/slot features using standard lithographic techniques;
(3) Etching the ridge and slot features;
(4) Application of a dielectric coating;
(5) Etching an opening in the dielectric along the top of the ridge structures;
(6) Deposition of contact metal;
(7) Cleaving into bar format;
(8) Application of facet coating (optional); and
(9) Singulation into individual devices.

Steps 2, 3, 4, 5 and 6 respectively are illustrated in FIG. 14, (a) to (e).

The slot patterns which were incorporated into the fabricated devices were designed to demonstrate two principal aspects of the invention. Namely the ability to fabricate single longitudinal mode laser diodes which emit at a stipulated wavelength, and the ability to manipulate the mirror loss spectrum of a laser diode so as to allow a laser emitting in a single longitudinal to operate over a predetermined temperature range without suffering from mode hops. It is noted that the data below was obtained on prototype samples, which were fabricated at the same time, and that the samples used in this these experiments had a high reflectivity coating applied to one facet, and a low reflectivity coating applied to the other facet.

Figure 15:
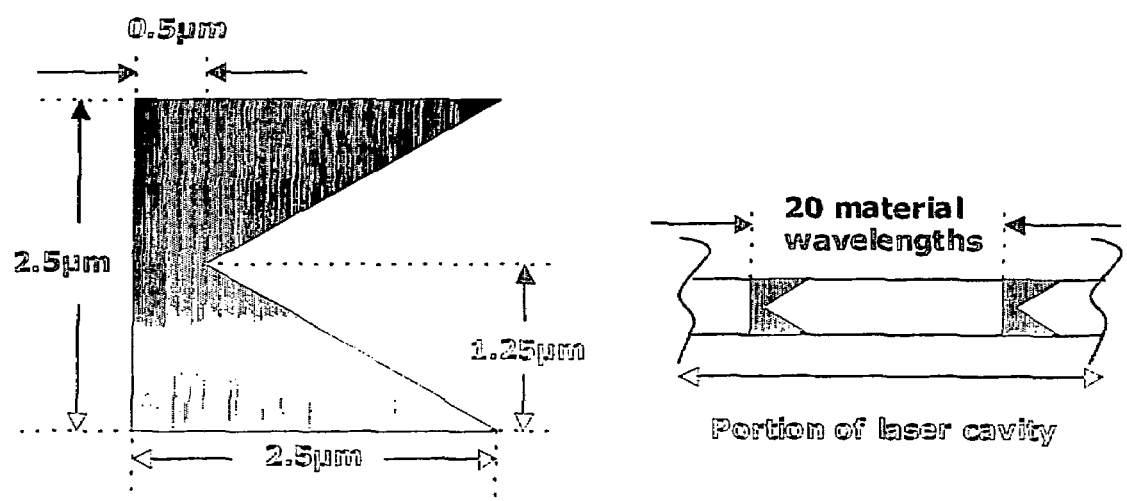
FIG. 15 illustrates aspects of the tapered slot pattern, which was used to experimentally demonstrate the utility of the present invention in fabricating laser diode devices having large effective free spectral ranges.
Figure 16:
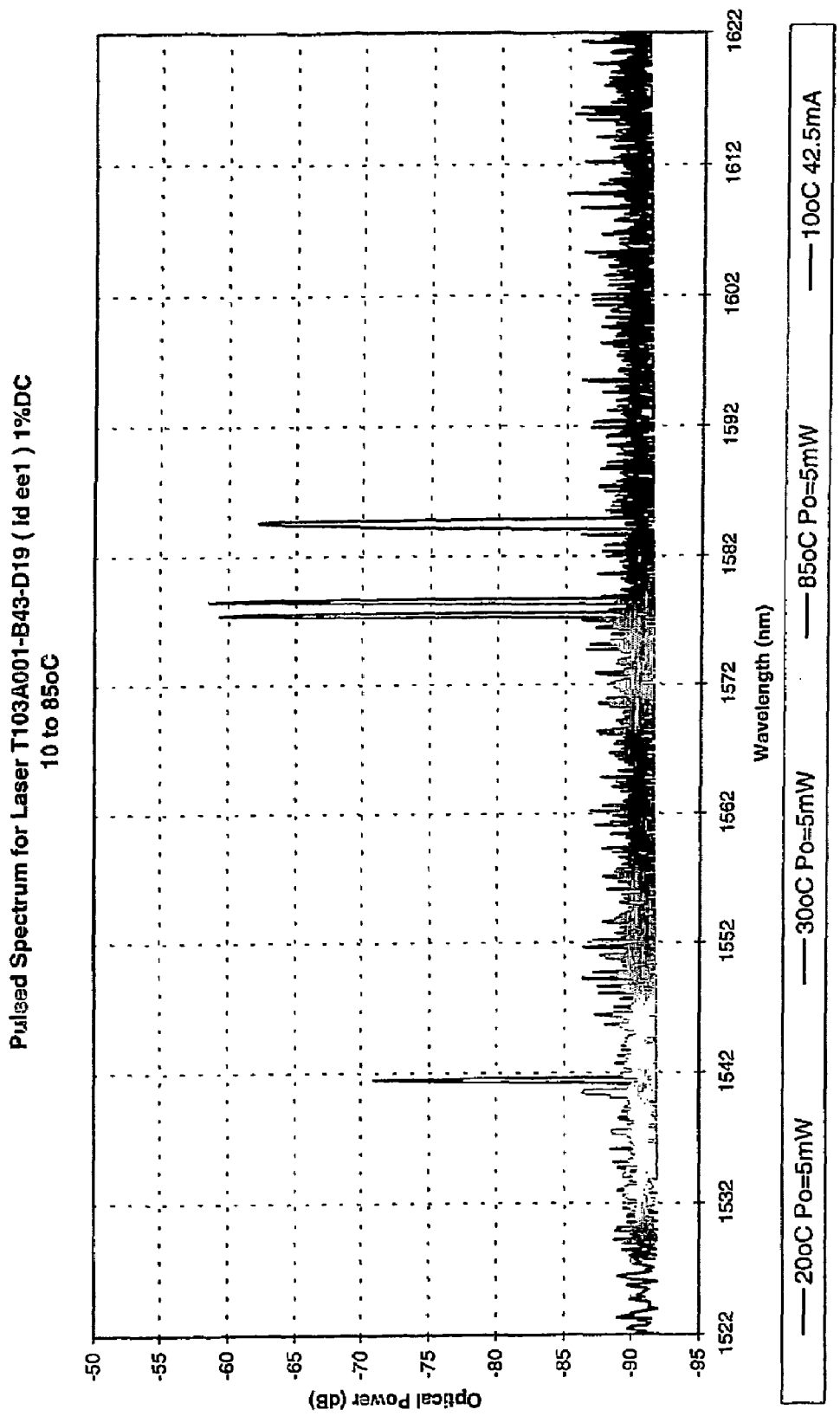
FIG. 16 combines the spectra of a device operating at 10° C., 20° C., 30° C. and 85° C., which incorporated the slot pattern illustrated in FIG. 15.
Figure 17:
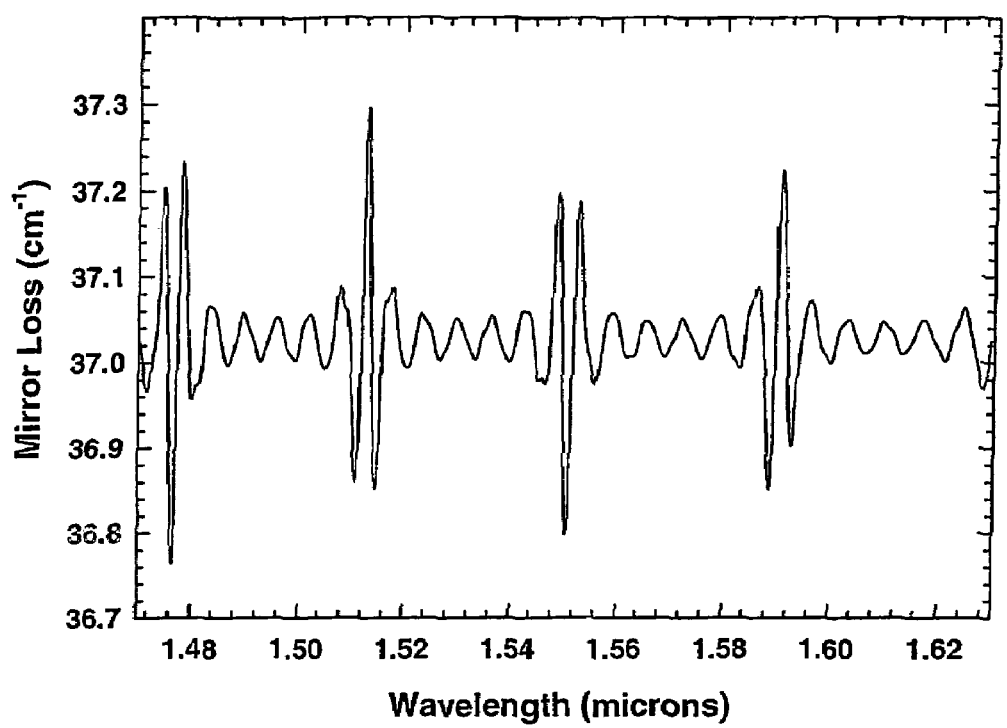
FIG. 17 is the calculated mirror loss spectra for the slot pattern illustrated in FIG. 15.

First the task of achieving single longitudinal mode operation over a predetermined temperature range is considered. The device was designed to lase in a single longitudinal at λ=1.585 μm, given an operating temperature 20° C. The measured lasing wavelength turned out to be 1.577 μm (operating at a temperature 20° C.). The difference between the design wavelength and experimentally measured wavelength was attributed to the fact that the effective index of the guided mode was not known to a high enough accuracy at design time. The design of the tapered slot features, which were incorporated into the first set of devices, is shown in FIG. 15. Given that there are twenty material wavelengths between the contributing interfaces of the slot features, the effective free spectral range of the device was calculated to be 36 nm. In total the device contained ten such etched features, the feature closest to the low reflectivity coating was positioned such that its contributing interface was 50 μm from the crystal facet that that is adjacent to the low reflectivity coating. FIG. 16 shows the wavelength spectra obtained from the device at 10° C., 20° C., 30° C. and 85° C. To allow interpretation of the graph it is noted the emission wavelength always increases with temperature. Mode hop free operation is demonstrated range over the temperature range 20° C. to 85° C., by virtue of the fact that the rate at which the wavelength tuned with temperature, over this range, was measured to be 0.1 nm/° C. It is also noteworthy that the emission wavelength at 10° C. is separated by approximately 36 nm from the emission wavelength 20° C. This shows that the effective free spectral range agrees with that predicted by theory (FIG. 17). The large effective free spectral ranges achieved with the present invention have not been obtained using devices incorporating conventional slot patterns.

Figure 18:
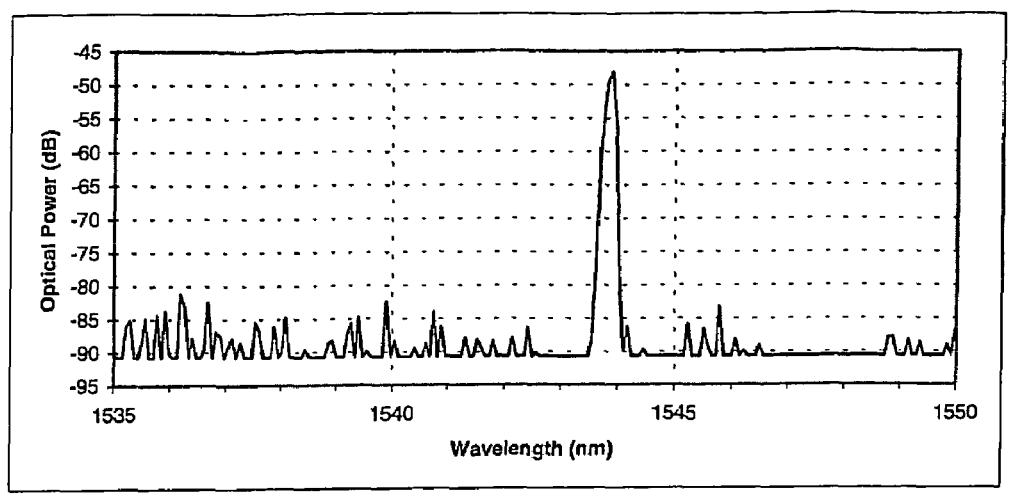
FIG. 18 is the measured wavelength spectrum from a device designed to emit at 1.550 µm.
Figure 19:
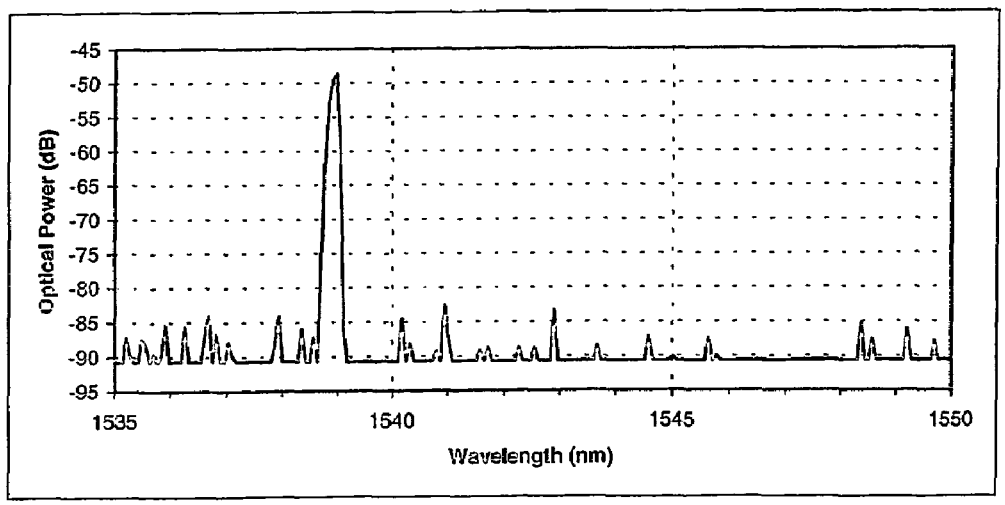
FIG. 19 is the measured wavelength spectrum from device designed to emit at 1.545 µm.
Figure 20:
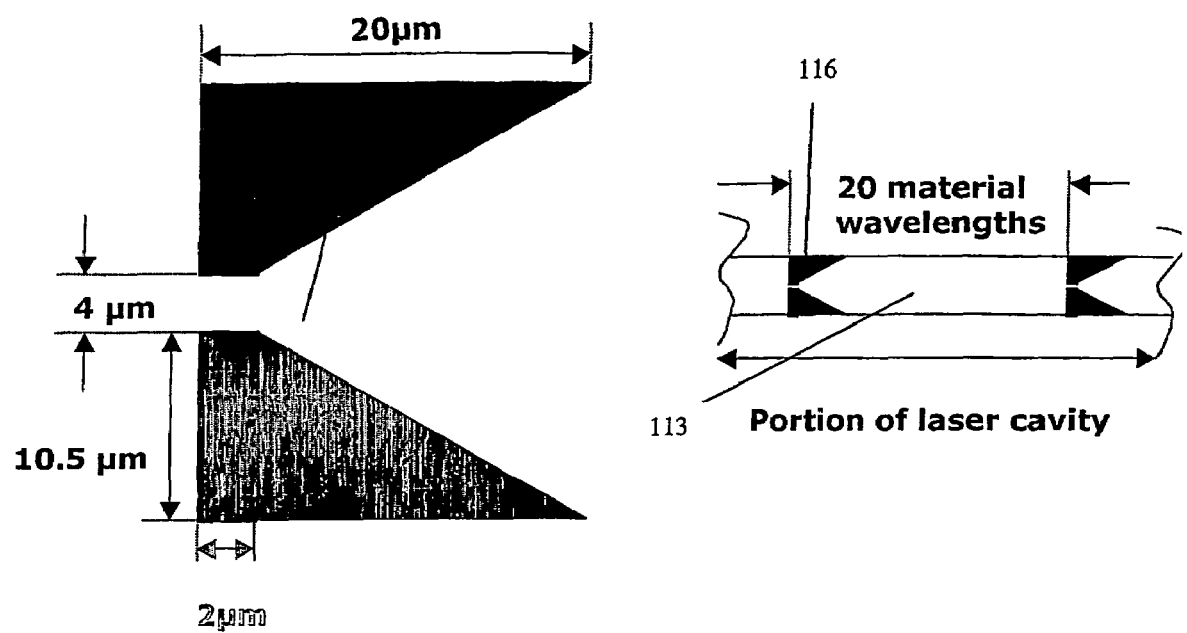
FIG. 20 details the tapered slot/indentation pattern used in the devices giving rise to the spectra shown in FIGS. 17 and 18.

Next, the ability to specify the emission wavelength of individual laser diode devices is considered. Two devices were designed to lase in a single longitudinal mode, the first at λ=1.550 μm and the second at λ=1.545 μm. In practice the emission of the first device was at 1.544 μm (FIG. 18), while that of the second was at 1.439 μm (FIG. 19). The design of the tapered indentations incorporated into this device is shown in FIG. 20 (this pattern demonstrates the utility of the present invention in fabricating laser diode devices whose emission wavelength can be specified with a high degree of accuracy). In total each device contained ten pairs of such indentations, the indentations closest to the low reflectivity coating were positioned such that their contributing interfaces were 50 μm from the crystal facet that that is adjacent to the low reflectivity coating. The only difference between patterns of indentations was that in first case the contributing interfaces of the slot features were designed to be spaced at twenty material wavelength appropriate to achieving emission a 1.550 μm, while in the second pattern the contributing interfaces of the slot features were designed to be separated by twenty wavelengths appropriate to achieving emission at 1.545 μm. As before the inability to specify the wavelength correctly is due to the fact that the precise value of the effective index was not known at design time. However it is noted that although the wavelengths of the individual devices are both 6 nm away from their respective design wavelength's, the separation between these wavelength's is 5 nm as specified. It is also noted that since the effective index of the lasing mode may be calculated from the wavelength emission spectra, the emission wavelengths of future devices may be specified much more accurately.

Figure 21:
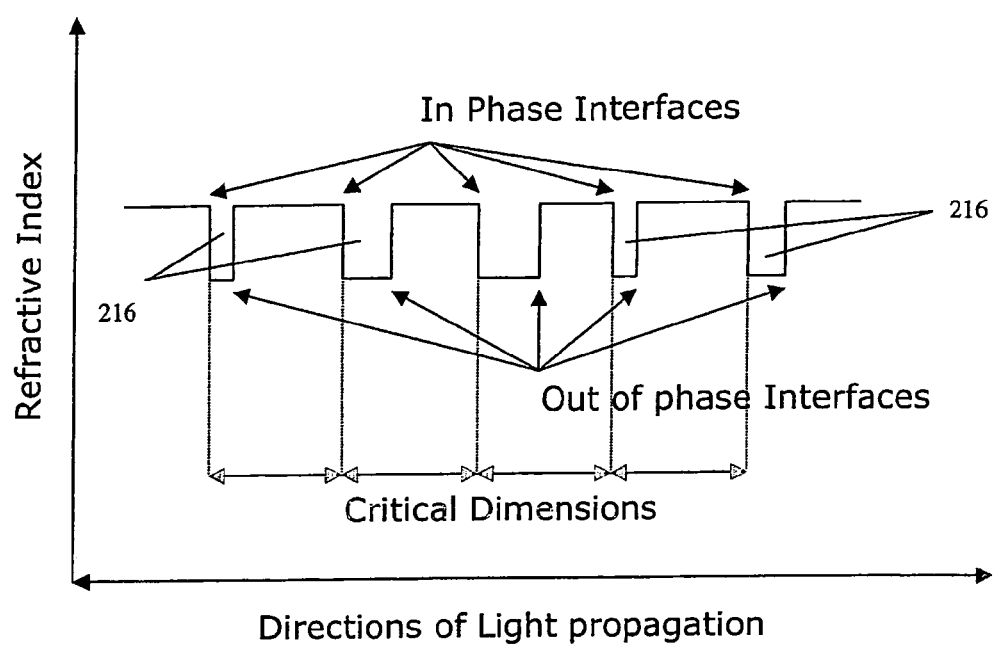
FIG. 21 illustrates an embodiment of the invention comprising chirped slots in which the lengths of individual slots differ.

Turning to FIG. 21, a further embodiment a laser according to the invention comprises a rectangular slot pattern which allows some of the manufacturing tolerances usually associated with these perturbation features to be relaxed. According to this embodiment the lengths of individual slots are varied (ie the lengths of two or more slots are different from each other). The first face (or contributing face) of each slot is aligned (or in phase) so as to interfere constructively with light reflected from other such faces and thus contribute to optical feedback along the optical path. However, the corresponding second faces are out of phase and cause destructive interference and thus are non-contributing in terms of the optical feedback along the optical path.

As with other embodiments, this embodiment of the invention has the advantage of facilitating greater manufacturing tolerances. From a manufacturing perspective the critical tolerances are reduced from the placement of two faces per slot (as is the case in prior art devices, as shown for example in FIGS. 1 to 3) to one face per slot as indicated in FIG. 21.

The invention claimed is:

1. A laser (10) emitting light of substantially a single wavelength, comprising a lasing cavity with a lasing medium and primary optical feedback means in the form of a facet (17) at either end of the cavity, the laser cavity defining a longitudinally extending optical path; and secondary optical feedback means formed by one or more effective refractive index perturbations in the lasing cavity, each perturbation defining two interfaces; characterised in that, for at least one of said perturbations, only one of the two interfaces contributes to optical feedback along the optical path.

2. A laser (10) according to claim 1 comprising a ridge (13) wherein at least one effective refractive index perturbation is provided in the form of a slot (16) defined in the ridge (13).

3. A laser (10) according to claim 2 wherein each perturbation comprises a slot (16) formed along the ridge (13).

4. A laser (10) according to any of claims 1 to 3 wherein the contributing interface of each perturbation is substantially planar.

5. A laser (10) according to any of claims 1 to 4 wherein the contributing interface of each perturbation is substantially perpendicular to the longitudinally extending optical path.

6. A laser (10) according to any of claims 2 to 5 wherein at least one slot (16) comprises a first face (18) which is substantially planar and substantially perpendicular to the longitudinally extending optical path and a second face (19) which is non-perpendicular to the optical path.

7. A laser (10) according to claim 6 wherein the second face (19) is substantially stepped, curved or angled with respect to the first face (18).

8. A laser according to claim 1 further comprising a ridge (113) wherein at least one effective refractive index perturbation is provided in the form of one or more indentations (116) defined in the side of the ridge (113).

9. A laser according to claim 8 wherein each perturbation is formed by indentations (116) defined in the ridge (113).

10. A laser (10) according to any of claims 1 to 9 comprising a series of effective refractive index perturbations wherein the spacing between adjacent contributing interfaces is a uniform number of quarter or half material wavelengths.

11. A laser (10) according to claim 10 wherein one or more additional series of effective refractive index perturbations are combined with the series of perturbations.

12. A laser according to claim 3 wherein the spacing between adjacent contributing interfaces is a uniform number of quarter or half material wavelengths and the lengths of two or more individual slots (216) are different from each other.

13. A method of manufacturing a laser (10) comprising the steps of:
    (1) forming a laser cavity with a lasing medium, the laser cavity defining a longitudinally extending optical path and having a facet (17) at either end, and
    (2) forming optical feedback means by introducing a plurality of perturbations into the laser cavity, each perturbation defining two longitudinal interfaces; characterised in that,
    the longitudinal interfaces of at least one perturbation are adapted such that only one interface contributes to optical feedback along the longitudinally extending optical path.

14. A method according to claim 13 wherein the cavity is formed with a longitudinally extending ridge (13) and at least one perturbation is provided by a slot (16) formed in the ridge (13).

15. A method according to claim 14 wherein at least one slot (16) is formed with a face (18) which is substantially planar and substantially perpendicular to the longitudinally extending optical path.

16. A method according to either of claims 14 and 15 wherein at least one slot (16) is formed with a face (19) which is non-perpendicular to the optical path.

17. A method according to claim 16 wherein the non-perpendicular face (19) is substantially curved, stepped or angled with respect to the substantially perpendicular face (18).

18. A method according to claim 13 wherein the cavity is formed with a longitudinally extending ridge (113) and at least one perturbation is provided by etching one or more indentations (116) in the side of the ridge (113).

19. A method of enhancing the free spectral range of a laser device (10) comprising the step of forming a series of effective refractive index perturbations along the optical path, each perturbation defining two interfaces; characterised in that, for each perturbation, only one of the two interfaces contributes to optical feedback along the optical path; and wherein the spacing between adjacent contributing interfaces is a uniform number of quarter material wavelengths.

* * * * *